(12) United States Patent
Ossmann et al.

(10) Patent No.: US 8,174,677 B2
(45) Date of Patent: May 8, 2012

(54) ILLUMINATION OPTICAL SYSTEM FOR MICROLITHOGRAPHY

(75) Inventors: Jens Ossmann, Aalen (DE); Martin Endres, Koenigsbronn (DE); Ralf Stuetzle, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 537 days.

(21) Appl. No.: 12/233,914

(22) Filed: Sep. 19, 2008

(65) Prior Publication Data

US 2009/0091731 A1    Apr. 9, 2009

Related U.S. Application Data

(60) Provisional application No. 60/978,439, filed on Oct. 9, 2007.

(30) Foreign Application Priority Data

Oct. 9, 2007  (DE) .................. 10 2007 048 467

(51) Int. Cl.
*G03B 27/54* (2006.01)
*G03B 27/70* (2006.01)
*G02B 5/08* (2006.01)

(52) U.S. Cl. .............. 355/67; 355/66; 359/861

(58) Field of Classification Search .............. 355/53, 355/66, 67; 359/850, 857, 861
See application file for complete search history.

(56) References Cited

U.S. PATENT DOCUMENTS

| | | | |
|---|---|---|---|
| 6,195,201 B1 | 2/2001 | Koch et al. | |
| 6,198,793 B1 | 3/2001 | Schultz et al. | |
| 6,452,661 B1 | 9/2002 | Komatsuda | |
| 6,507,440 B1 * | 1/2003 | Schultz | 359/626 |
| 6,658,084 B2 | 12/2003 | Singer | |
| 2003/0002023 A1 * | 1/2003 | Bunau et al. | 355/67 |
| 2003/0043455 A1 | 3/2003 | Singer et al. | |
| 2005/0088760 A1 * | 4/2005 | Mann et al. | 359/730 |
| 2005/0270513 A1 * | 12/2005 | Dierichs et al. | 355/67 |
| 2006/0132747 A1 | 6/2006 | Singer et al. | |

FOREIGN PATENT DOCUMENTS

| | | |
|---|---|---|
| EP | 1 026 547 | 8/2000 |
| EP | 1 225 481 | 7/2002 |
| WO | WO 2005/026843 | 3/2005 |

\* cited by examiner

*Primary Examiner* — Hung Henry Nguyen
*Assistant Examiner* — Steven H Whitesell Gordon
(74) *Attorney, Agent, or Firm* — Fish & Richardson P.C.

(57) ABSTRACT

The disclosure provides an illumination optical system for microlithography that is designed so that, even with a change of illumination setting (e.g., a change in the given illumination conditions in the object field), variation of illumination parameters over the object field is confined within predetermined tolerances.

20 Claims, 5 Drawing Sheets

ILLUMINATION OPTICAL SYSTEM FOR MICROLITHOGRAPHY

CROSS-REFERENCE TO RELATED APPLICATIONS

This application claims the benefit under 35 U.S.C. §119 (e)(1) of U.S. Ser. No. 60/978,439, filed Oct. 9, 2007. This application also claims priority under 35 U.S.C. §119 to German patent application 10 2007 048 467.6, filed Oct. 9, 2007. The contents of these application are hereby incorporated by reference.

FIELD

The disclosure relates to illumination optical systems for microlithography, such as EUV-microlithography, as well as related systems, components and methods.

BACKGROUND

Illumination optical systems for microlithography are known. In such systems, illumination parameters for the object field (parameters which characterize the illumination conditions in the object field) can include the distribution of illumination intensities and illumination angles assigned to the individual object field points.

SUMMARY

In some embodiments, the disclosure provides an illumination optical system for microlithography that is designed so that, even with a change of illumination setting (e.g., a change in the given illumination conditions in the object field), variation of illumination parameters over the object field is confined within predetermined tolerances.

In certain embodiments, the disclosure provides an illumination optical system for microlithography for guiding an illuminating light-bundle from a light source towards an object field. The system can include a facet element with a plurality of facets which are arranged in a plane across the direction of incidence of the illuminating light-bundle and offset relative to one another within the cross section of the illumination light bundle for forming the illuminating light-bundle to provide defined illumination conditions in the object field. The system can also include a subsequent optical system following the facet element for transferring the illuminating light into the object field. The facet element influences the illuminating light-bundle such that an influence of the subsequent optical system varying over the illuminating light-bundle on the intensity of bundle portions of the illuminating light-bundle is compensated for.

It has been recognised that the influence on the guiding of the illuminating light-bundle by the illumination optical system over a facet element can be used to compensate an intensity influence which varies over the cross section of the bundle by the subsequent optical system to the facet element. Light paths, which in the subsequent optical system, due for example to unfavourable reflection angles up to the object field experience increased losses, are provided for compensation for example with facets of the facet element, which compared to other light paths transfer a greater intensity of illuminating light incidental to the facet element. This results in an excess of intensity, which is cleared by subsequent losses in the entire subsequent optical system following the facet element up to the object field, so that in the object field the desired illumination parameters are achieved. The facet element can be used to generate a mixture of illuminating light portions such that a corresponding intensity limit is ensured sufficiently precisely even for different illumination settings. The assignment of the facets of the facet element, which can be a field facet element, to light paths in the subsequent optical system can be over-layered by an assignment, which is used for example for setting prespecified illumination settings or for evening out the object field illumination. In EUV-lithography the advantages of the illumination optical system can be particularly beneficial, as the bundle guiding components to illuminate light-bundle, due to their guiding properties, which are generally very dependent on the angle of incidence, often result in an influence, varying over the illumination bundle, on the subsequent optical system following the facet element.

In some embodiments, an additional facet mirror is arranged in the subsequent optical system. Here the aforementioned intensity action can be ensured by the assignment of the facet channels. The second facet mirror is often a facet mirror, which is arranged in a pupil plane of a projection optical system arranged after the illumination optical system or in a plane conjugate thereto, such as a pupil facet mirror. Instead of a system with two facetted mirrors, a system with only one facetted mirror is also possible. The latter can for example be designed in the form of a specular reflector or in the form of a multi-mirror-array. A specular reflector can be designed as described in US 2006/0132747 A1. A multi-mirror-array can be designed as described in WO 2005/026843 A.

In some embodiments, an intensity action is ensured, in that specific sections of the sub-sequent optical system receive illuminating light portions with a greater number of facets of the facet element than other sections of the subsequent optical system. In certain embodiments, those sections of the subsequent optical system, which experience increased losses, are impinged with field facets, which in turn are supplied with greater intensity. Optionally, there can be a 1:1 assignment between facet elements arranged behind one another, for example between a field and a pupil facet element.

In some embodiments, the telecentric value over the object field is at most 0.5 mrad. The ellipticity value over the object field can be at most 3%.

In certain embodiments, the subsequent optical system allows a mixing overlayering of portions of the illuminating light-bundle in the object field guided over the individual facets.

An EUV light source can be used to allow the possibility of a particularly high structural resolution during projection.

BRIEF DESCRIPTION OF THE DRAWINGS

Exemplary embodiments of the disclosure are explained in more detail in the following with reference to the drawings. In which.

DETAILED DESCRIPTION

Figure 1:
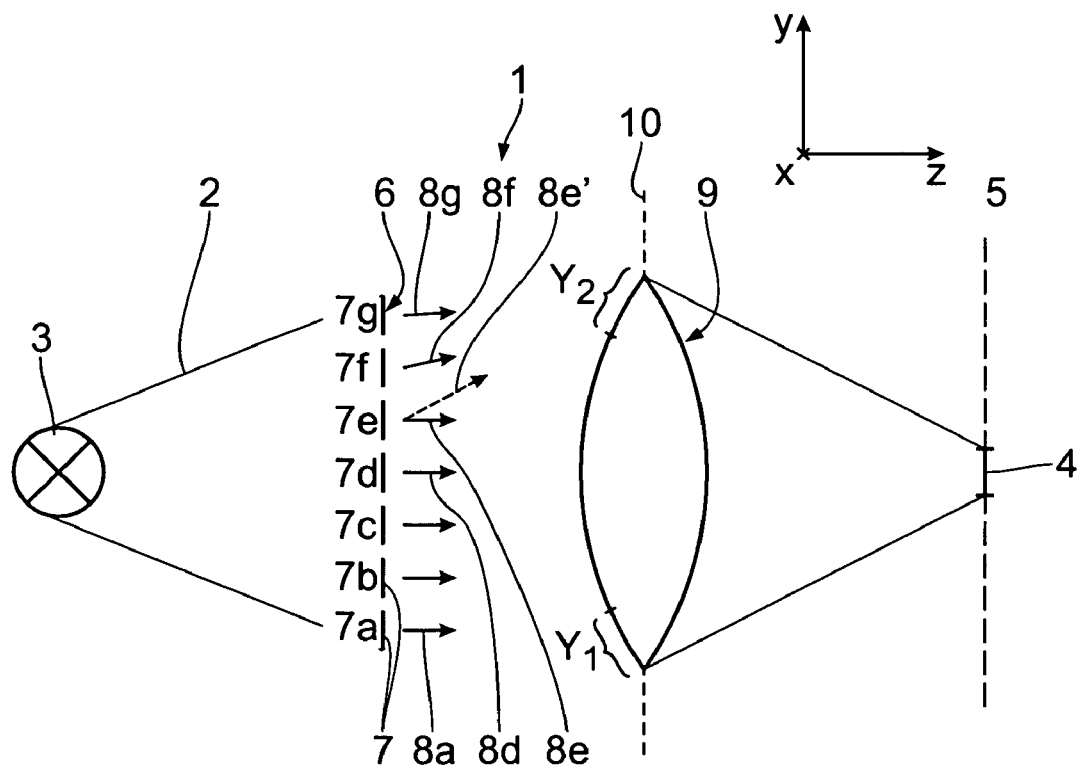
FIG. 1 shows very schematically an illumination optical system for EUV-microlithography.

FIG. 1 shows in a meridian section in a very schematic manner an illumination optical system 1 for EUV-microlithography. An EUV illuminating light bundle 2 with an EUV (extreme ultraviolet) wavelength of, for example, 10 nm to 30 nm is generated by an EUV light source 3. The illumination optical system 1 is used for guiding the illuminating light bundle 2 from the light source 3 to an object field 4. In an object plane 5 there is a reticle, i.e. a structure to be imaged.

To facilitate the representation of relative positions in the following an xyz-coordinate system is used. The x-direction runs in FIG. 1 across the plane of the drawing into the latter. The y-direction runs upwards in FIG. 1 and z-direction runs to the right in FIG. 1. The main direction of incidence of the illuminating light bundle 2 is in z-direction.

The illuminating light bundle 2 is shaped by a facet element 6. In this way defined illumination conditions are provided in the object field 4. The facet element 6 has a plurality of individual facets 7. Each of these facets 7 guides an assigned portion 8 of the illuminating light bundle 2.

A total of seven such facets 7 are shown schematically in FIG. 1. In general, however, there are a much greater number of such facets. These seven facets 7 are labelled alphabetically in FIG. 1 from bottom to top, so that the bottom facet in FIG. 1 is denoted by 7a and the top facet in FIG. 1 by 7g. Portions 8a to 8g of the illuminating light bundle 2 are assigned to the facets 7a to 7g.

The facets 7 are arranged for example distributed in the form of a matrix in the xy-plane and cover the latter where the illuminating light bundle 2 meets the facet element 6. In some embodiments, the arrangement of facets 7 is similar to a mosaic. The individual facets 7 can be actively tilted, for example via suitably associated actuators.

The optical components of the illumination optical system 1 are represented schematically as transmissive components. In general, however, these are reflective components. The facet element 6 can thus represent as a whole a mirror, which is arranged across the illuminating light bundle 2.

Arranged after the facet element 6 is a subsequent optical system 9 for transferring the illuminating light bundle 2 divided into portions 8a to 8g into the object field 4. The detailed structure of the subsequent optical system 9 is explained in the following. In general, the subsequent optical system 9 is configured as a plurality of individual, reflective optical components. For simplicity of explanation, however, the optical effect of all of these components is symbolised in FIG. 1 by a single lens. The lens is arranged in a pupil plane 10. The latter is a pupil plane of a projection optical system which is arranged after the illumination optical system 1 after the object field 4 for imaging the object field in an image field. The projection optical system is not shown in FIG. 1. The pupil plane 10 may be a pupil plane conjugate relative to the entry pupil plane of the following projection optical system.

Figure 2:
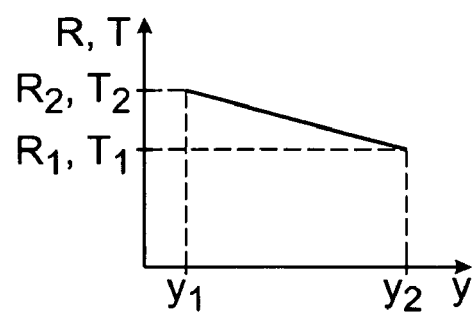
FIG. 2 shows schematically the path of a reflection or transmission of a subsequent optical system to a facet element of the illumination optical system, measured across a main direction of incidence of an illuminating light bundle.

FIG. 2 shows schematically the reflectivity R and transmission T (generally, the intensity influence of the illuminating light bundle 2 by the subsequent optical system 9), depending on whether or not it is a reflective or transmissive optical system. In this case the dependency of the intensity influence R, T is shown over the y-direction. Starting with the smallest y-coordinate $y_1$, which corresponds to the lowest y-value, i.e. the position of the lowest section $Y_1$ of the subsequent optical system 9 in y-direction, up to the largest y-coordinate $y_2$, which corresponds to the position of the uppermost section $y_2$ in FIG. 1 of the subsequent optical system 9, the intensity influence R, T drops linearly from a value $R_2$, $T_2$ at the y-coordinate $y_1$ to a value $R_1$, $T_1$ at the y-coordinate $y_2$. A different variation path of the intensity influence over the y-coordinate is possible depending on the structure and the optical components of the subsequent optical system 9 used. Over the x-coordinates of the subsequent optical system 9 there can also be an intensity influence. Often the intensity influence varying over the bundle cross section is not as described above, but such that central bundle portions, for example bundle portion 8d in FIG. 1, experience fewer losses than edge bundle portions, such as, for example bundle portions 8a and 8g. An inverse intensity influence can also occur.

In some embodiments, the facets 7a to 7g influence the illuminating light bundle 2 such that the influence of the subsequent optical system 9, which is shown in FIG. 2 and varies over the pupil plane 10 and thus also over the object field 4, is compensated exactly to the intensity of the portions or part bundles 8a to 8g of the illuminating light bundle 2.

A first compensation variant over the facet element 6 is shown in FIG. 1 by solid arrows, which symbolise the portions 8a to 8g. The facets 7a to 7g are tilted so that section $Y_1$ with greater reflectivity and transmission is impinged with light with an absolutely lower number of portions 8 of the illuminating light bundle 2 assigned to the individual facets 7 than section $Y_2$ with lower reflectivity R or transmission T. This occurs in that at least individual facets 7a to 7g are aligned more significantly in the direction of section $Y_2$. This is shown in FIG. 1 schematically with reference in particular to the facets 7f, 7g, the assigned illuminating light portions 8f and 8g of which are guided in the direction of section $Y_2$. Section $Y_2$ is thus impinged by a total of two portions 8, namely portions 8f and 8g. Section $Y_1$ is impinged however only by one portion 8, namely portion 8a. The lower reflectivity R and transmission T of section $Y_2$ is compensated in this way.

A variant of possible compensation via the facet element 6 is indicated in FIG. 1 by a dashed illuminating light portion 8e'. This compensation variant makes use of the fact that the individual facets 7a to 7g are typically impinged by the light source 3 with different integral intensities. In the illuminating light bundle 2 there is generally not a homogenous, uniform intensity distribution. In the example shown the facet 7e is impinged with an integral intensity, which is greater than that with which the facet 7a is charged. The illuminating light portion 8e' of facet 7e is supplied by a corresponding tilting of facet 7e to section $Y_2$ of the subsequent optical system 9. Section $Y_1$ receives the portion 8a with lower intensity. Also in this variant the lower reflectivity and transmission of section $Y_2$ of the subsequent optical system 9 is compensated.

Figure 3:
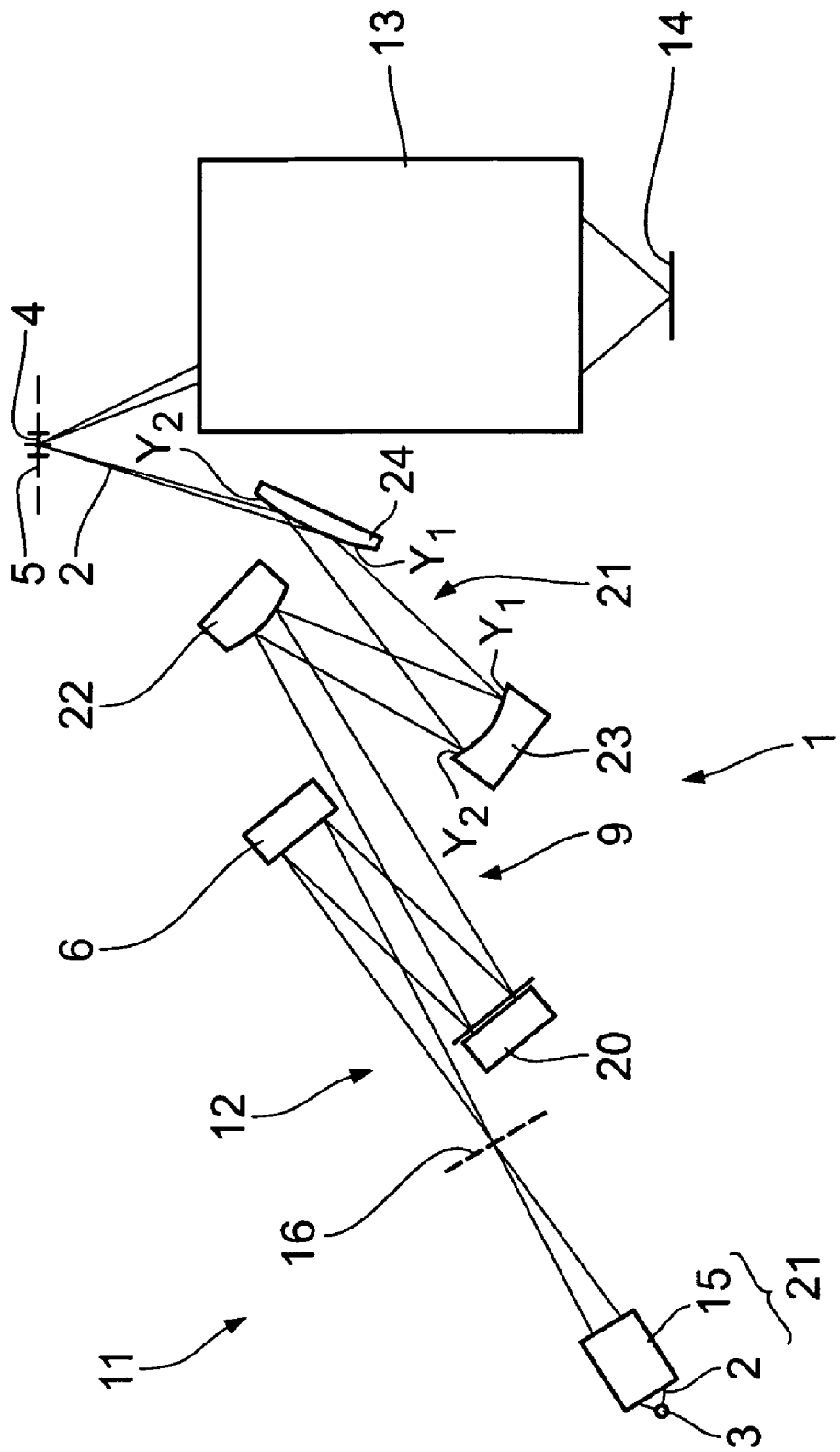
FIG. 3 shows in more detail the spatial layout of the illumination optical system inside an EUV-projection exposure apparatus.

FIG. 3 shows the illumination optical system 1 together with further components of a projection exposure apparatus 11, in particular with components of the subsequent optical system 9 in more detail. The projection exposure apparatus 11 is in the form of a scanner. The scanning direction runs parallel to the short field axis of the object or image field. Alternatively, it is possible to design the projection exposure apparatus 11 as a stepper (a step-wise operating device), whereby the direction of the stepwise method corresponds to the scanning direction of the scanner.

A illumination system 12 of the projection exposure apparatus 11 includes the illumination optical system 1 and the light source 3. FIG. 3 shows schematically the projection optical system 13 as well as an image plane 14, in which the image field is arranged. A structure is displayed on the reticle in the object plane 5 on a light-sensitive layer of a wafer arranged in the region of the image field in the image plane 14, which is not shown in the drawing.

The illuminating light bundle 2 is bundled, starting with the light source 3, firstly by a collector 15. Suitable collectors are known for example from EP 1 225 481 A and US 2003/0043455 A. After the collector 15 the illuminating light bundle 2 propagates firstly through an intermediate focus plane 16, before it meets the facet element 6, which in the embodiment according to FIG. 3 is in the form of a field facet mirror.

Figure 4:
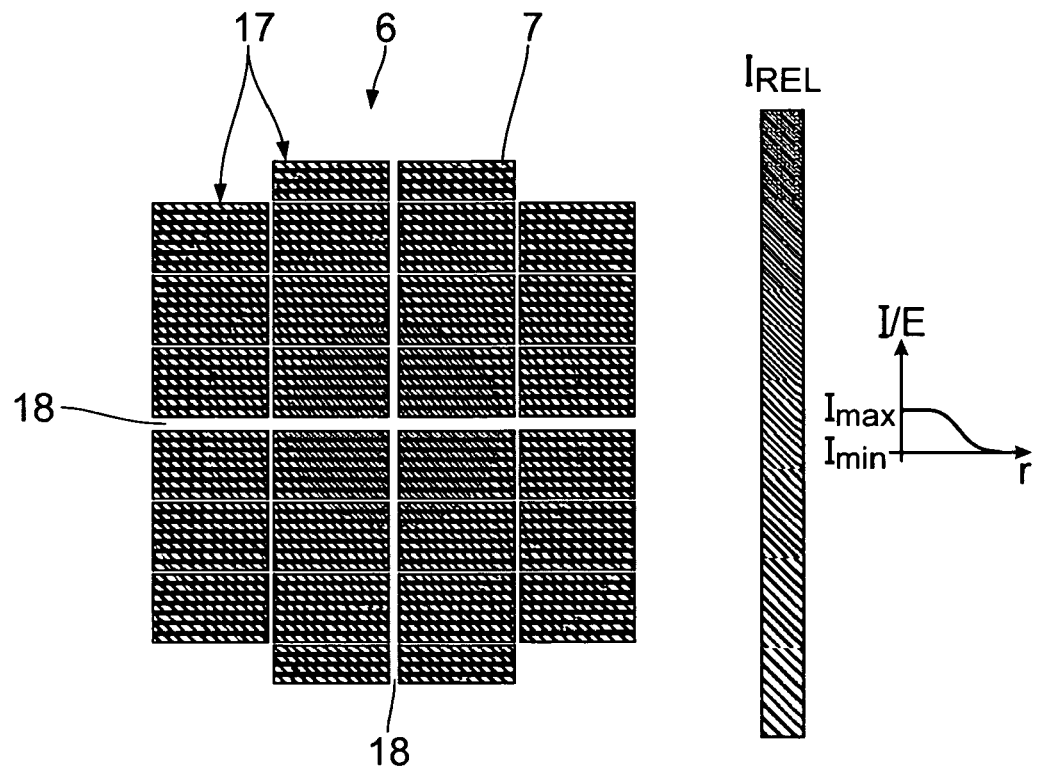
FIG. 4 shows a field facet mirror of the illumination optical system according to FIG. 3, wherein the field facets are impinged with illuminating light of varying intensity.

FIG. 4 shows an enlarged view of the field facet mirror 6. The latter consists of a plurality of facet groups 17 arranged in columns and rows, which in turn consist of a plurality of rectangular facets 7. The facets 7 are extended lengthwise rectangularly with a very high aspect ratio, which corresponds to the aspect ratio of the object field 4. Instead of the straight facets 7 shown in FIG. 4 bent facets can also be used. Such straight or bent facets 7 of the field facet mirror 6 are known from U.S. Pat. No. 6,452,661 and U.S. Pat. No. 6,195,201. The field facet mirror 6 is composed of several different types of facet groups 17, which differ in the number of facets 7. The facet groups 17 shown at the top in FIG. 4 for example have four facets 7 arranged above one another. The facet groups 17 arranged directly below each have seven facets 7 arranged above one another. The field facet mirror 6 can also include facet groups with an even greater number of facets 7. Due to central and radial shading generated by the collector 15 the field facet mirror 6 has facet free areas 18.

Each part bundle 8 of the illuminating light bundle 2 is reflected by a specific facet 7. Each of these part bundles 8 meets a pupil facet 19 assigned in turn to the part bundle 8 (compare FIG. 5) of a pupil facet mirror 20, which is arranged after the field facet mirror 6. The pupil facets 19 are round and arranged in the form of a plurality of facet rings arranged concentrically to one another. An innermost facet ring 20a includes four pupil facets 19. Overall the pupil facet mirror 20 has nine facet rings. Other numbers of facet rings are also possible. Via the field facet mirror 6 at the site of the pupil facets 19 of the pupil facet mirror 20 secondary light sources are generated. The pupil facet mirror 20 is arranged in a plane of the illumination optical system 1, which coincides with a pupil plane of the projection optical system 13 or is conjugate optically thereto. The pupil facet mirror 19 can thus be arranged in particular in the pupil plane 10.

Via the pupil facet mirror 19 and a transferring optical system 21 the facets 7 of the field facet mirror 6 are displayed in the object plane 5. The transferring optical system 21 includes three reflecting mirrors 22, 23, 24 arranged after the pupil facet mirror 20. In the design of the illumination optical system 1 according to FIG. 3 the subsequent optical system 9 following the field facet mirror 6 includes the pupil facet mirror 19 as well as the transferring optical system 21.

The mirror 24, i.e. the last mirror diverting the illuminating light bundle 2 in front of the object plane 5, is an image-field forming mirror for grazing incidence. In an area $Y_1$ the illuminating light bundle 2 meets the mirror 24 with a greater angle of incidence than in a section $Y_2$ spaced apart from the first section $Y_1$ across a main direction of incidence of the incidental illuminating light-bundle 2. The incidence on the section $Y_2$ is thus less grazing but steeper than in section $Y_1$. It is also the case that the reflectivity of the mirror 24 in section $Y_1$ is greater than in section $Y_2$. The sections $Y_1$ and $Y_2$ therefore have properties in the mirror 24 like sections $Y_1$, $Y_2$, which were explained above in connection with the subsequent optical system 9 according to FIG. 2.

Even in the case of the other reflecting components of the illumination optical system 1 depending on the meeting point of the illuminating light bundle 2 on the reflecting components (on the mirrors or facet elements 6, 20, 22, 23), there are different angles of incidence for the illuminating light. Accordingly also sections $Y_1$ with greater reflectivity and sections $Y_2$ with lower reflectivity can be assigned to these further components of the illumination optical system 1. This is shown in FIG. 3 in the example of the mirror 23.

Figure 6:
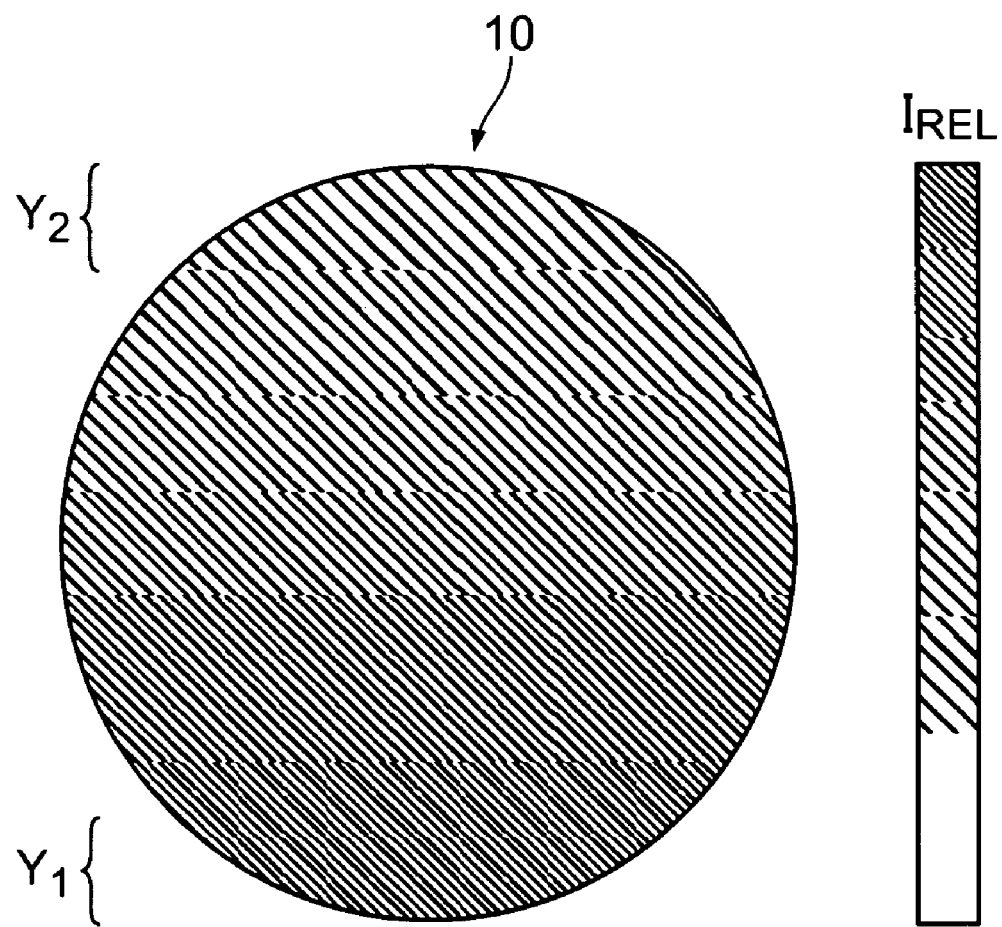
FIG. 6 shows a site-dependent intensity influence of the subsequent optical system following the facet element over a pupil plane of a projection optical system of the projection exposure apparatus according to FIG. 3, which is arranged after the illumination optical system.

Overall the components 20, 22, 23, 24, which are arranged after the field facet mirror 6, i.e. the subsequent optical system 9, can be assigned a site-dependent intensity influence over the pupil plane 10, which for example can be determined by measuring the site-dependent reflectivities of these components. FIG. 6 shows such a site-dependent intensity influence. Areas of greater intensity impingement in the pupil plane 10 are hatched more closely than areas with lower intensity impingement. In FIG. 6 on the right a relative intensity bar IREL is shown, which illustrates the allocation of the hatching densities to the respective relative intensity. Section $Y_1$ has the greatest level of reflectivity for all of the components arranged after the field facet mirror 6, i.e. the least intensity reduction. Area $Y_2$ has the greatest intensity reduction, i.e. the least reflectivity. Between areas $Y_1$ and $Y_2$ the reflectivity drops approximately linearly, so that the site-dependent intensity influence, shown in FIG. 6, corresponds qualitatively to that of FIG. 1.

In the case of the second compensation variant, which has been explained above, there is now such an assignment of the facets 7 of the field facet mirror 6 to the pupil facets 19 of the pupil facet mirrors 20, that via the site-dependent impingement of the pupil facets 19 with illuminating light portions 8 of different intensities the site-dependent intensity influencing of the subsequent optical system 9 is compensated for. For this a section $Y_1$ of the pupil facet mirror 20, which within the subsequent optical system 9 has the greatest reflectivity according to FIG. 6, receives light from field facets, which are impinged by the light source 3 with comparatively low intensity, such as light from edge facet groups in x-direction, i.e. in the direction of the long axis of the object field 4. Section $Y_2$, which in the subsequent optical system 9 has comparatively low reflectivity (compare FIG. 6), can however be impinged with facets 7 of field facet groups 17, which are supplied by the light source 3 with comparatively high intensity. As a rule these are the central facet groups 17 adjacent to the central crossing point of the facet-free area 18.

The assignment of the facets 7 of the field facet mirror 6 to the pupil facets 19 is such that on average over the areas $Y_1$, $Y_2$ and over the intermediate sections of the pupil facet mirror 20 there are intensity impingements, which compensate the differences in the intensity influence by these sections. In addition, there is a mixture and redistribution of the portions 8 on the pupil facet mirror 20, to produce the evening out of the illumination. In order to achieve this mixing, adjacent pupil facets 19 are impinged with portions 8 of the illuminating light bundles 2 which vary in intensity.

This mixture can be such that even when to produce pre-specified illumination settings (conventional, annular, dipolar, multipolar) specific areas of the pupil facet mirrors 20 are shaded, the compensation of the intensity influence is retained by the subsequent optical system 9 following the field facet mirror 6.

FIGS. 7 to 11 show optical parameters or illumination parameters dependent on a illumination setting on the determination of the site-dependent intensity influencing of the sub-sequent optical system 9. In this case this optical system is illuminated by a illumination-bundle 2, the intensity of which is constant over the cross section. In the object field 4 the site-dependent intensity influence in the pupil plane can be determined by the subsequent optical system 9.

The optical parameters or illumination parameters discussed in the following are telecentric values Tx, Ty, ellipticity values $E_{0°/90°}$, $E_{-45°/45°}$, respectively dependent on a sigma-value, and uniformity.

Tx and Ty are defined as follows:

In each field point of the illuminated object field a heavy beam of a light bundle assigned to this field point is defined. The heavy beam in this way has the energy-weighted direction of the light bundle coming from this field point. In an ideal case with each field point the heavy beam runs parallel to the main beam provided by the illumination optical system 1 or the projection optical system 13.

The direction of the main beam $\vec{s}_0(x,y)$ is known from the design data of the illumination optical system 1 or projection optical system 13. The main beam is defined at a field point by the connecting line between the field point and the middle point of the entry pupil of the projection optical system 13. The direction of the heavy beam at a field point x, y in the object field in the object plane 5 is calculated as:

$$\vec{s}(x,y) = \frac{1}{\tilde{E}(x,y)} \int dudv \begin{pmatrix} u \\ v \end{pmatrix} E(u,v,x,y).$$

E (u,v,x,y) is the energy distribution for the field point x,y depending on the pupil coordinates u,v, i.e. depending on the illumination angle, that the corresponding field point x, y sees.

$\tilde{E}(x,y) = \int dudv E(u,v,x,y)$ is in this case the total energy with which point x,y is impinged.

A central object field point $x_0$, $y_0$ sees e.g. the radiation of radiation part-bundles from directions u,v, which is defined by the position of the respective pupil facets 19. The heavy beam s passes with this illumination only along the main beam, when the different energies or intensities of the radiation part bundles assigned to the pupil facets 19 combine to form a heavy beam direction integrated over all pupil facets 19, which runs parallel to the main beam direction. This is only in an ideal case. In practice there is a deviation between the heavy beam direction $\vec{s}(x,y)$ and the main beam direction $\vec{s}_0(x,y)$, which is known as a telecentric error $\vec{t}(x,y)$:

$$\vec{t}(x,y) = \vec{s}(x,y) - \vec{s}_0(x,y)$$

In practical operation the projection exposure apparatus 11 needs to be corrected and not the static telecentric errors with a specific object field, but the scan-integrated telecentric errors at $x=x_0$. This is produced by:

$$\vec{T}(x_0) = \frac{\int dy \tilde{E}(x_0, y) \vec{t}(x_0, y)}{\int dy \tilde{E}(x_0, y)}.$$

Thus the telecentric error is corrected, which a point (x, z, B, $x_0$) running through the object field in the object plane 5 during scanning experiences on the reticle energy-weighted and integrated. A distinction is made in this case between an x-telecentric error (Tx) and a y-telecentric error (Ty). The y-telecentric error is defined as a deviation of the heavy beam from the main beam perpendicular to the scanning direction. The x-telecentric error is defined as the deviation of the heavy beam from the main beam in scanning direction.

A illumination setting with a sigma-value of x is present when 90% of the energy of illumination distribution is in the angular space within a circle of x-times the aperture of the projection optical system 13. The sigma-value is thus a measure of the size of the maximum illumination angle, with which an image field point is charged. A definition of the sigma-value corresponding to this is found in U.S. Pat. No. 6,658,084 B2. In FIGS. 7 to 11 the optical variables dependent on the respective sigma-value are shown. According to the insert in FIG. 11 a line is assigned to each sigma-value, which is either continuous or a characteristic interruption (dashed, characteristically dot-dashed). The sigma-value "≦0.3" includes the continuous line in FIGS. 7 to 11. Corresponding lines with respectively assigned characteristic interruptions belong to the sigma-values "smaller than 0.5", "between 0.55 and 0.75", "between 0.65 and 0.85" and "smaller than 0.9". Each sigma-value is assigned to a illumination setting, as already explained above.

Figure 7:
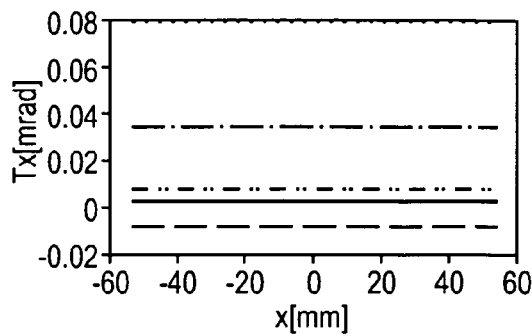
FIGS. 7 to 11 show diagrams of the field dependency of the optical parameters telecentry, ellipticity and uniformity for different illumination settings in a case not according to the disclosure, when the site-dependent intensity influence according to FIG. 4 is not compensated.

FIG. 7 shows the dependency of the telecentry in x-direction, Tx, from the selected conventional illumination setting in the pupil plane 10. The telecentry dependent on a sigma value is shown which is correlated with the maximum angle of incidence of the illuminating light on the field points in the object plane 4. A sigma, which is greater than 0.9, leads to a Tx-value of about 0.005 mrad. A sigma between 0.65 and 0.85 leads to a Tx-value of about 0.035 mrad. A sigma in the region of between 0.55 and 0.75 leads to a Tx-value of 0.08 mrad. Lower sigma-values lead to absolutely smaller Tx-values.

Figure 8:
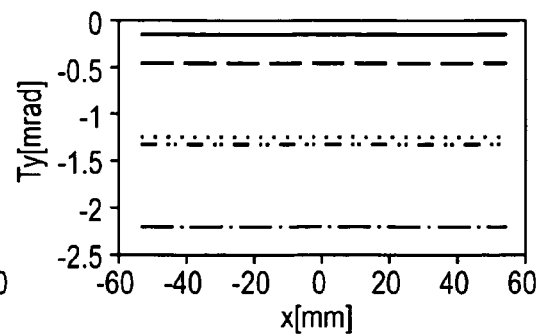

FIG. 8 shows the path of telecentry in y-direction, Ty. Here there is a much clearer dependency of the Ty value on the sigma value compared to the Tx-value. With a sigma-value between 0.65 and 0.85 there is Ty-value which is greater than −2 mrad.

The ellipticity is a further measurement parameter for assessing the quality of the illumination of the object field in the object plane 5. The determination of the ellipticity allows a more precise statement to be made about the distribution of energy or intensity over the entry pupil of the projection optical system 13. For this the entry pupil is divided into eight octants, which are numbered anticlockwise from $O_1$ to $O_8$, as usual in mathematics. The amount of energy or intensity that the octants $O_1$ to $O_8$ of the entry pupil contribute to illumination a field point is described in the following as the energy and intensity contribution $I_1$ to $I_8$.

The following variable is denoted as −45°/45°-ellipticity (Elly, $E_{-45°/45°}$)

$$E_{-45°/45°} = \frac{I1 + I2 + I5 + I6}{I3 + I4 + I7 + I8}$$

and as 0°/90°-ellipticity (Ellx, $E_{0°/90°}$) the following variable $$E_{0°/90°} = \frac{I1 + I8 + I4 + I5}{I2 + I3 + I6 + I7}.$$

According to the aforementioned description relating to the telecentric error the ellipticity for a specific object field point $x_0$, $y_0$ or also for a scan-integrated illumination ($x=x_0$, y-integrated) can also be determined.

Figure 9:
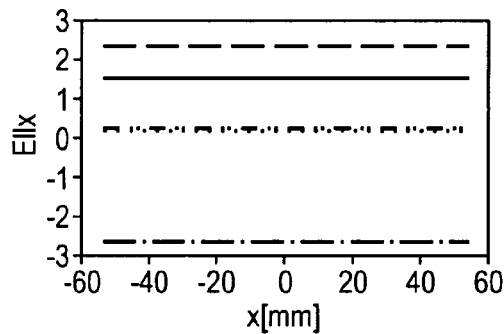
Figure 10:
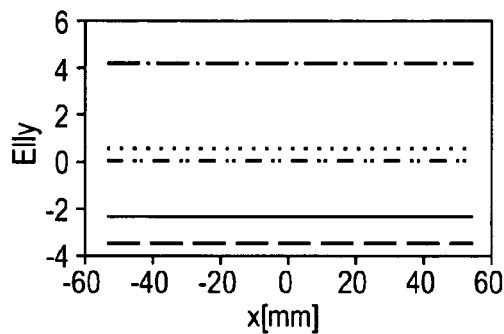

FIGS. 9 and 10 show the dependencies of ellipticity values $E_{0°/90°}$ and $E_{-45°/45°}$ of the sigma values. Here too there is sensitive dependency of the ellipticity values according to which sigma is present, i.e. depending on which illumination setting is used.

Uniformity is defined as the scan-integrated total energy integrated in y-direction at an x-value of the image field in the image plane 14. The uniformity is usually standardised at the average value over all of the x-values of the image field.

Figure 11:
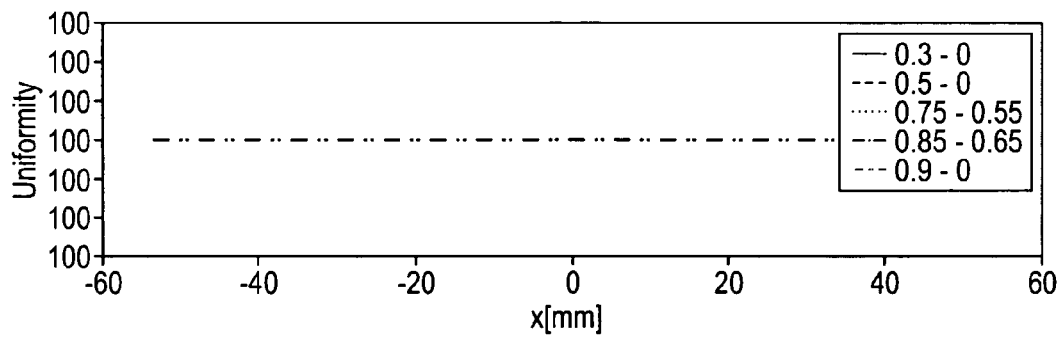

FIG. 11 shows the uniformity, i.e. the illumination intensity per field point of the object field 4, at each x-value integrated over the entire y-extension of the object field 4. In the present case the uniformity is independent of the setting, as FIGS. 7 to 11 only show the influence of the subsequent optical system 9. In particular the subsequent optical system 9 acts here only on the intensity in the pupil plane. Other cases, in which the subsequent optical system has an intensity influence dependent on the site in the field, are also possible. If the intensity influenced depends solely on the site in the pupil plane, the uniformity is independent from the illumination setting and the intensity distribution in the pupil plane, as each field point sees the illumination light integrated over the entire pupil plane.

FIGS. 7 to 11 shows the illumination parameters respectively dependent on the x-coordinates of the object field 4, i.e. across the scan direction of the projection exposure apparatus 11.

The diagrams according to FIGS. 7 to 11 relate to an embodiment of the subsequent optical system 9, in which the mirror 24 is not a field-forming mirror. If the mirror 24 is designed as a field-forming mirror, there are additional contributions to the influence of the illumination parameters shown in FIGS. 7 to 11 by the reflectivity in the pupil plane. There is then not simply an offset of the telecentric values Tx, Ty over the x-coordinates, but due to the properties of the field-forming mirror 24 a sinusoidal or co-sinusoidal path is produced. Depending on the layout of the subsequent optical system 9 also other influences of the illumination parameters shown in FIGS. 7 to 11 can be produced by the intensity influence of the subsequent optical system 9 in the pupil plane.

Figure 5:
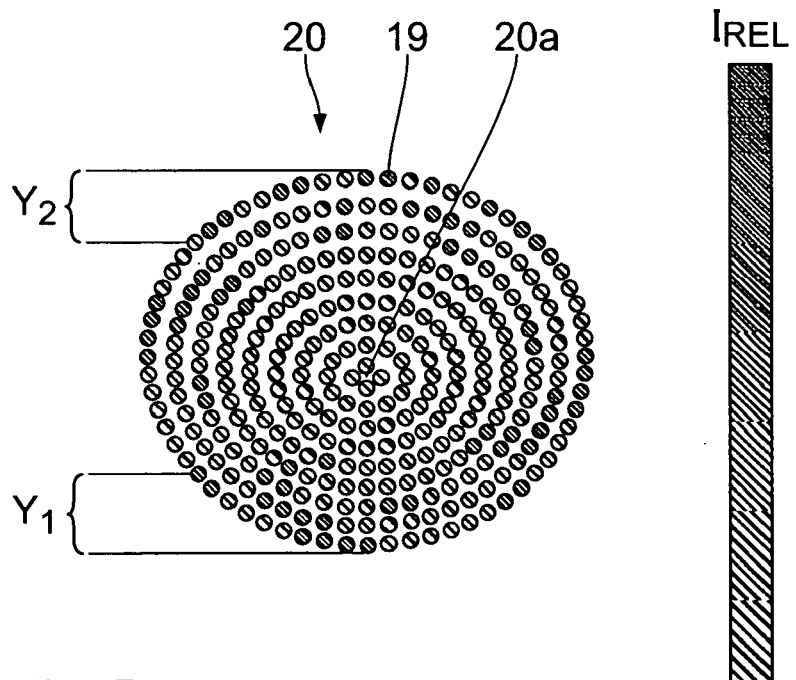
FIG. 5 shows a pupil facet mirror of the illumination optical system according to FIG. 3, wherein the pupil facets of the pupil facet mirror are illuminated by assigned field facets of the field facet mirror according to FIG. 4.

After determining the site-dependent intensity influence over the object field 4, whereby this can be specified by determining the optical characteristics Tx, Ty, $E_{0°/90°}$, $E_{-45°/45°}$ discussed above, there is then, as explained in connection with FIGS. 4 and 5, an allocation of the facets 7 of the field facet element 6 to the pupil facets 19, so that the sigma-dependent intensity influencing of the subsequent optical system 9 following the field facet element 6 is compensated. The resulting illumination optical system has a sigma-independent telecentric-value Tx, Ty within given tolerances over the object field 4 of a maximum of 1 mrad (e.g., 0.5 mrad). The ellipticity value $E_{0°/9°}$, $E_{-45°/45°}$ over the object field 4 is after the completed assignment a maximum of 5% (e.g., a maximum of 3%).

Other embodiments are in the claims.

What is claimed is:

1. An illumination system configured to guide light from a light source toward an object field along a light path, the illumination system comprising:
   a first mirror in the light path, the first mirror comprising a first plurality of facets arranged in a plane across a direction of incidence of the light, the facets being offset relative to one another within the plane;
   a second mirror in the light path, the second mirror comprising a second plurality of facets; and
   an optical system following the second mirror along the light path, the optical system configured to have an influence on intensities of bundle portions of the light,
   wherein:
      the first mirror is configured to compensate for the influence of the optical system on the intensities of the bundle portions of the light,
      each of the first plurality of facets is assigned to a corresponding facet of the second plurality of facets,
      an optical element of the optical system has a first section and a second section which is spaced apart from the first section in a direction perpendicular to the light path,
      the first section of the optical element has a first reflectivity for the light,
      the second section of the optical element has a second reflectivity for the light,
      the first reflectivity is greater than the second reflectivity,
      for each corresponding facet of the second plurality of facets, the facet is assigned to the first section of the optical element or to the second section of the optical element,
      during use, the light impinging on a first facet of the second mirror that is assigned to the first section of the optical element has an integral power intensity that is lower than an integral power intensity of light impinging on a second facet of the second mirror that is assigned to the second section of the optical element, and
      the illumination system is configured to be used in microlithography projection exposure apparatus.

2. The illumination system of claim 1, wherein the first mirror is configured to exactly compensate for the influence of the optical system on the intensities of the bundle portions of the light.

3. The illumination system of claim 1, wherein, during use, a telecentric value of at most 1 mrad is produced over the object field.

4. The illumination system of claim 1, wherein, during use, an ellipticity value of at most 5% is produced over the object field.

5. The illumination system of claim 1, wherein the optical system is an imaging optical system configured to image the plurality of facets of the first mirror into the object field or in a field plane conjugate to the object field.

6. An apparatus, comprising:
   a light source; and
   an illumination system according to claim 1,
   wherein the apparatus is a microlithography projection exposure apparatus.

7. The apparatus according to claim 6, wherein the light source is an EUV-light source.

8. The apparatus of claim 6, further comprising a projection objective.

9. A method, comprising:
providing a microlithography projection exposure apparatus comprising a light source, an illumination system according to claim 1, and a projection objective;
emitting radiation from the light source so that the light impinges on the first mirror, the second mirror and the optical system of the illumination system, and then illuminating a reticle in the object plane; and
after illuminating the reticle, using the projection objective to project the reticle onto a photosensitive object to produce microstructured components.

10. An apparatus, comprising:
an illumination system according to claim 1; and
a projection objective,
wherein the apparatus is a microlithography projection exposure apparatus.

11. An illumination system configured to guide light from a light source toward an object field along a light path, the illumination system comprising:
a first mirror in the light path, the first mirror comprising a first plurality of facets arranged in a plane across a direction of incidence of the light, the facets being offset relative to one another within the plane;
a second mirror in the light path, the second mirror comprising a second plurality of facets; and
an optical system following the second mirror along the light path, the optical system configured to have an influence on intensities of bundle portions of the light,
wherein:
the first mirror is configured to compensate for the influence of the optical system on the intensities of the bundle portions of the light,
each of the first plurality of facets is assigned to a corresponding facet of the second plurality of facets,
an optical element of the optical system has a first section and a second section which is spaced apart from the first section in a direction perpendicular to the light path,
the first section of the optical element has a first reflectivity for the light,
the second section of the optical element has a second reflectivity for the light,
the first reflectivity is greater than the second reflectivity,
for each corresponding facet of the second plurality of facets, the facet is assigned to the first section of the optical element or to the second section of the optical element, and
the illumination system is configured to be used in microlithography projection exposure apparatus, and
wherein during use:
a first number of bundle portions of light impinge on a first section of the second mirror that is assigned to the first section of the optical element,
a second number of bundle portions of light impinge on a second section of the second mirror that is assigned to the second section of the optical element, and
the first number of bundle portions of light is less than the second number of bundle portions of light.

12. An apparatus, comprising:
a light source; and
an illumination system according to claim 11,
wherein the apparatus is a microlithography projection exposure apparatus.

13. The apparatus according to claim 12, wherein the light source is an EUV-light source.

14. The apparatus of claim 12, further comprising a projection objective.

15. An apparatus, comprising:
an illumination system according to claim 11; and
a projection objective,
wherein the apparatus is a microlithography projection exposure apparatus.

16. An illumination system configured to guide light from a light source toward an object field along a light path, the illumination system comprising:
a first mirror in the light path, the first mirror comprising a first plurality of facets arranged in a plane across a direction of incidence of the light, the facets being offset relative to one another within the plane;
a second mirror in the light path, the second mirror comprising a second plurality of facets; and
an optical system following the second mirror along the light path, the optical system configured to have an influence on intensities of bundle portions of the light,
wherein:
the first mirror is configured to compensate for the influence of the optical system on the intensities of the bundle portions of the light,
each of the first plurality of facets is assigned to a corresponding facet of the second plurality of facets,
an optical element of the optical system has a first section and a second section which is spaced apart from the first section in a direction perpendicular to the light path,
the first section of the optical element has a first reflectivity for the light,
the second section of the optical element has a second reflectivity for the light,
the first reflectivity is greater than the second reflectivity,
for each corresponding facet of the second plurality of facets, the facet is assigned to the first section of the optical element or to the second section of the optical element,
during use, bundle portions of the light impinging on a first facet of the second mirror that is assigned to the first section of the optical element are less intensive than bundle portions of the light impinging on a second facet of the second mirror that is assigned to the second section of the optical element, and
the illumination system is configured to be used in microlithography projection exposure apparatus.

17. An apparatus, comprising:
a light source; and
an illumination system according to claim 16,
wherein the apparatus is a microlithography projection exposure apparatus.

18. The apparatus according to claim 17, wherein the light source is an EUV-light source.

19. The apparatus of claim 17, further comprising a projection objective.

20. An apparatus, comprising:
an illumination system according to claim 16; and
a projection objective,
wherein the apparatus is a microlithography projection exposure apparatus.

* * * * *

UNITED STATES PATENT AND TRADEMARK OFFICE
CERTIFICATE OF CORRECTION

PATENT NO. : 8,174,677 B2  
APPLICATION NO. : 12/233914  
DATED : May 8, 2012  
INVENTOR(S) : Jens Ossmann It is certified that error appears in the above-identified patent and that said Letters Patent is hereby corrected as shown below:

Column 2,  
Line 31, delete "sub-sequent" and insert --subsequent--

Column 7,  
Line 8, delete "sub-sequent" and insert --subsequent--

Column 10,  
Line 4, delete "$E_{0°/9°}$," and insert --$E_{0°/90°}$,--

Signed and Sealed this  
Twenty-sixth Day of June, 2012

David J. Kappos  
*Director of the United States Patent and Trademark Office*